US 011532708B2

(12) United States Patent
Liebmann et al.

(10) Patent No.: US 11,532,708 B2
(45) Date of Patent: Dec. 20, 2022

(54) STACKED THREE-DIMENSIONAL FIELD-EFFECT TRANSISTORS

(71) Applicant: Tokyo Electron Limited, Tokyo (JP)

(72) Inventors: Lars Liebmann, Mechanicsville, NY (US); Jeffrey Smith, Clifton Park, NY (US); Daniel Chanemougame, Niskayuna, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/334,422

(22) Filed: May 28, 2021

(65) Prior Publication Data

US 2022/0181441 A1 Jun. 9, 2022

Related U.S. Application Data

(60) Provisional application No. 63/121,597, filed on Dec. 4, 2020.

(51) Int. Cl.
| | | |
|---|---|---|
| *H01L 29/10* | (2006.01) | |
| *H01L 29/06* | (2006.01) | |
| *H01L 29/78* | (2006.01) | |
| *H01L 29/66* | (2006.01) | |

(52) U.S. Cl.
CPC ...... *H01L 29/1029* (2013.01); *H01L 29/0665* (2013.01); *H01L 29/66818* (2013.01); *H01L 29/785* (2013.01)

(58) Field of Classification Search
CPC .......... H01L 29/1029; H01L 29/42392; H01L 29/0665; H01L 29/66818; H01L 29/785; H01L 29/78696; H01L 27/092
See application file for complete search history.

(56) References Cited

U.S. PATENT DOCUMENTS

| 8,765,563 B2 | 7/2014 | Pillarisetty et al. |
| 9,634,007 B2 | 4/2017 | Pillarisetty et al. |
| 10,304,832 B1 | 5/2019 | Chauemougame et al. |

(Continued)

OTHER PUBLICATIONS

International Search Report and Written Opinion dated Feb. 7, 2022 in PCT/US2021/054648, 9 pages.

*Primary Examiner* — Wasiul Haider
(74) *Attorney, Agent, or Firm* — Oblon, McClelland, Maier & Neustadt, L.L.P.

(57) ABSTRACT

A semiconductor device includes a first field-effect transistor positioned over a substrate, a second field-effect transistor stacked over the first field-effect transistor, a third field-effect transistor stacked over the second field-effect transistor, and a fourth field-effect transistor stacked over the third field-effect transistor. A bottom gate structure is disposed around a first channel structure of the first field-effect transistor and positioned over the substrate. An intermediate gate structure is disposed over the bottom gate structure and around a second channel structure of the second field-effect transistor and a third channel structure of the third field-effect transistor. A top gate structure is disposed over the intermediate gate structure and around a fourth channel structure of the fourth field-effect transistor. An inter-level contact is formed to bypass the intermediate gate structure from a first side of the intermediate gate structure, and arranged between the bottom gate structure and the top gate structure.

12 Claims, 13 Drawing Sheets

(56) References Cited

U.S. PATENT DOCUMENTS

| | | |
|---|---|---|
| 10,861,852 B2 | 12/2020 | Li et al. |
| 11,158,544 B2 | 10/2021 | Cheng et al. |
| 2014/0091360 A1 | 4/2014 | Pillarisetty et al. |
| 2014/0291726 A1 | 10/2014 | Pillarisetty et al. |
| 2017/0162453 A1 | 6/2017 | Pillarisetty et al. |
| 2019/0148376 A1 | 5/2019 | Chauemougame et al. |
| 2020/0075574 A1 | 3/2020 | Smith et al. |
| 2020/0075592 A1 | 3/2020 | Liebmann et al. |
| 2020/0111798 A1* | 4/2020 | Paul .................. H01L 21/76895 |
| 2020/0144264 A1 | 5/2020 | Li et al. |
| 2020/0294866 A1 | 9/2020 | Cheng et al. |
| 2021/0280582 A1* | 9/2021 | Lu ....................... H01L 29/0847 |

\* cited by examiner

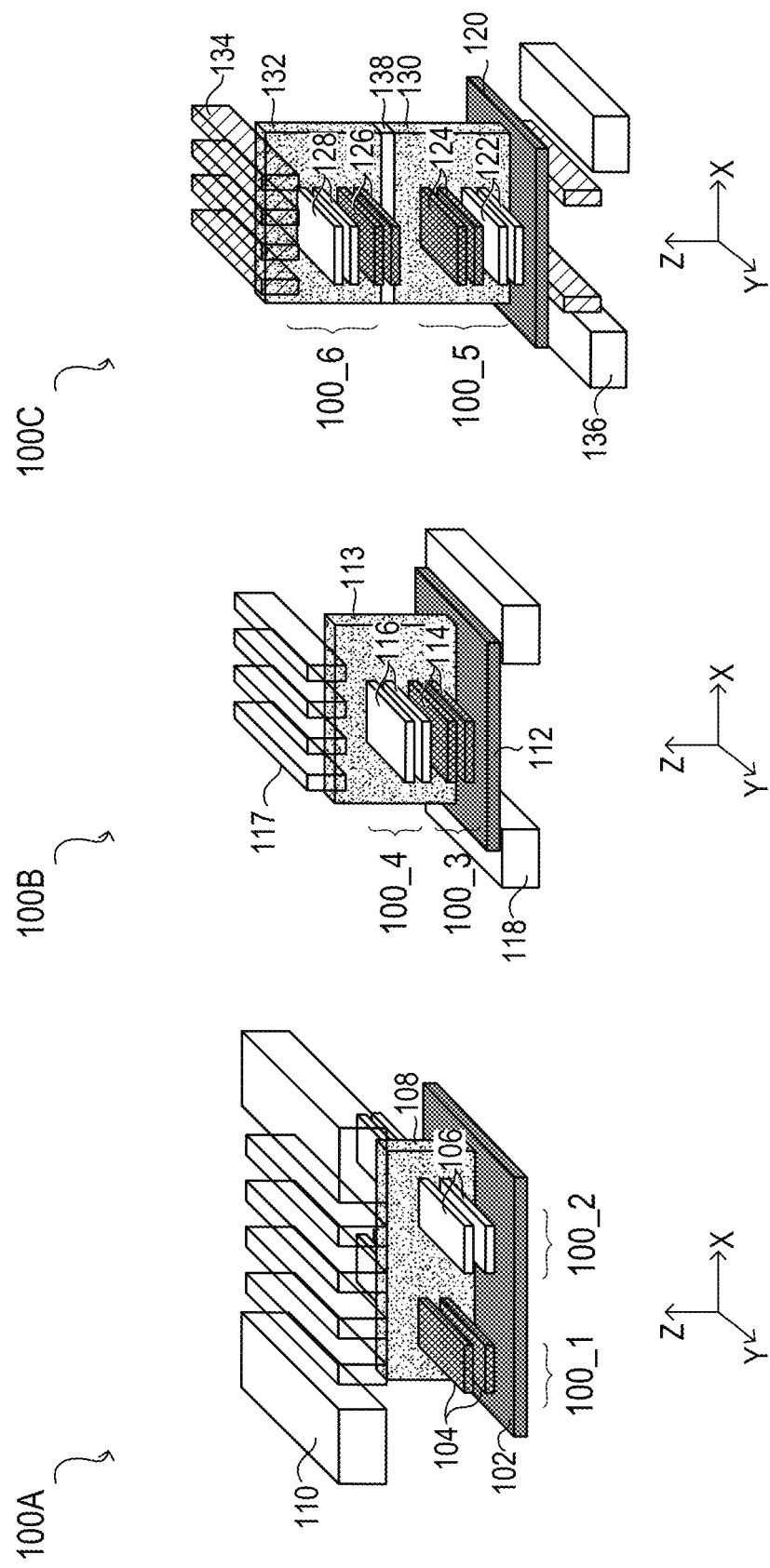

FIG. 4

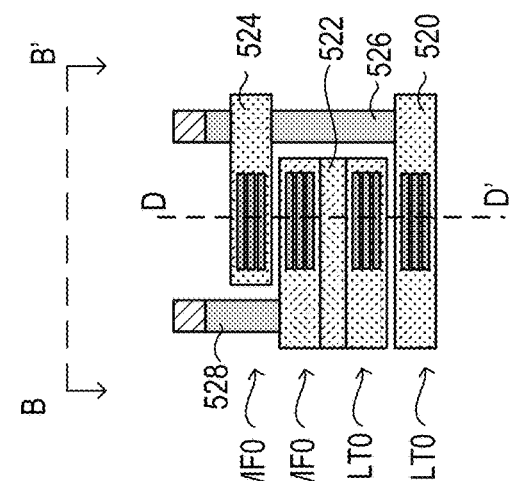
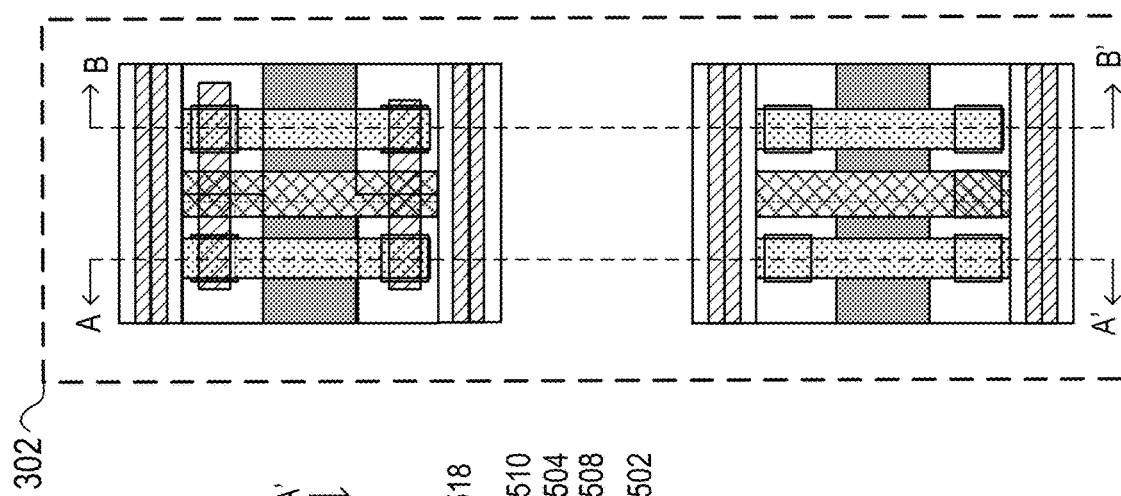
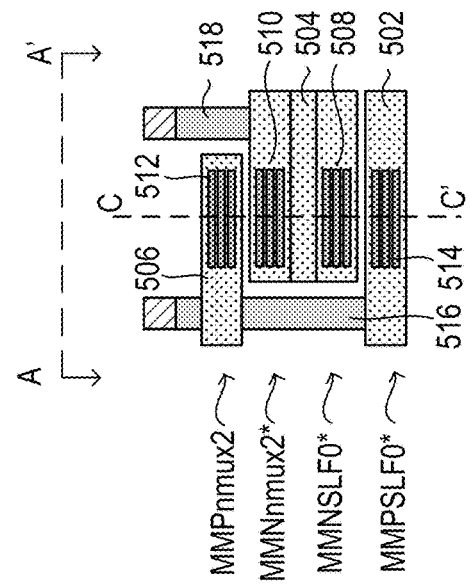
FIG. 5A
FIG. 5B
FIG. 5C

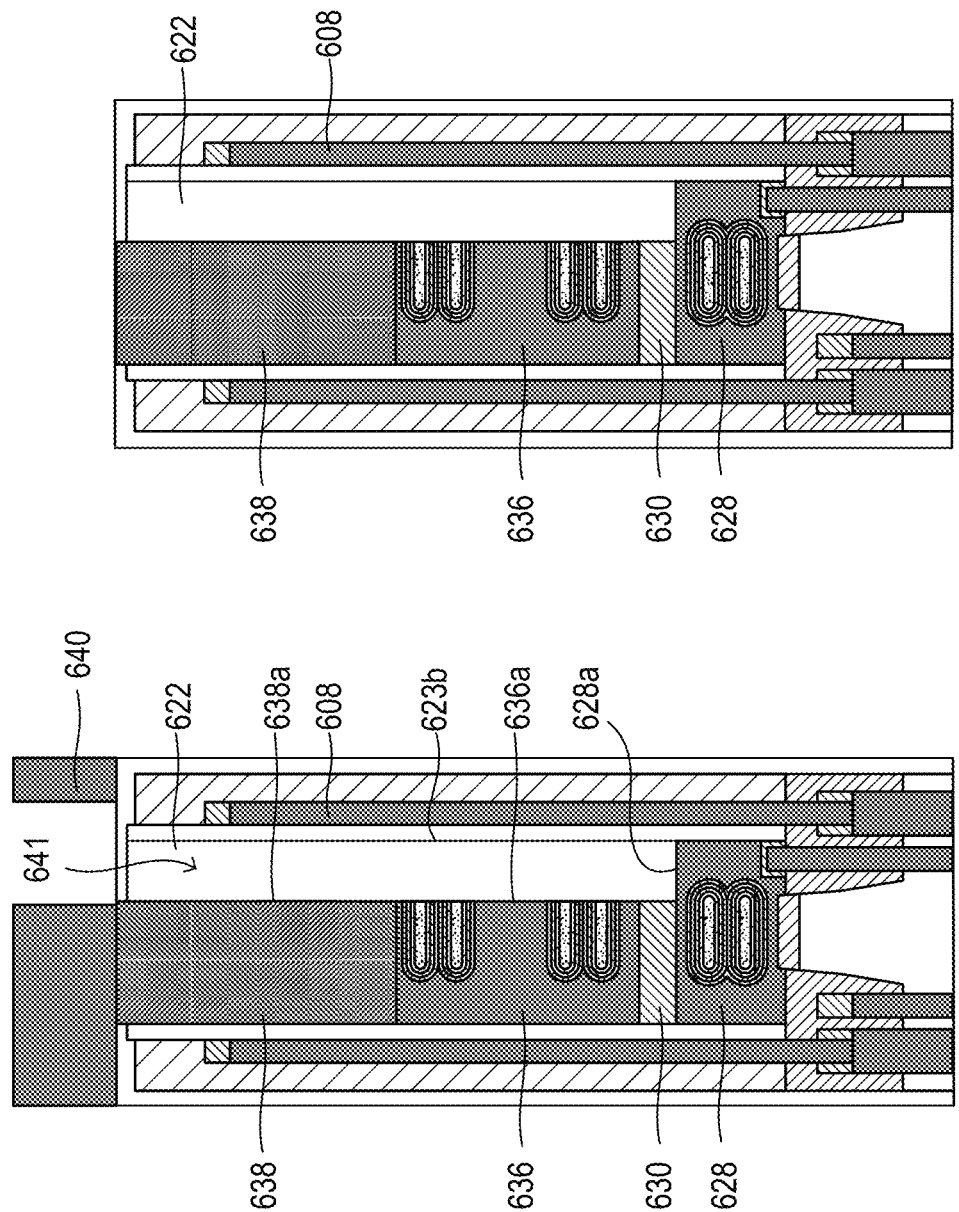

STACKED THREE-DIMENSIONAL FIELD-EFFECT TRANSISTORS

CROSS REFERENCE TO RELATED APPLICATIONS

This present application claims the benefit of priority to U.S. Provisional Application No. 63/121,597 filed on Dec. 4, 2020, which is incorporated by reference herein in its entirety.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Techniques herein include a novel construct and the associated process integration solution that enables an efficient and compact integration of transistors into dense 3D logic functions. 3D integration, i.e., the vertical stacking of multiple devices, aims to overcome scaling limitations experienced in conventional two dimensional VLSI by increasing the transistor density in volume rather than area. The particular 3D integration (3Di) solution here is particularly applicable to a transistor-on-transistor (ToT) 3Di. In ToT 3Di multiple field-effect transistors (FET) are stacked vertically on top of each other. As illustrated in FIGS. 1A and 1B, the most basic form of ToT 3Di is the complementary FET (CFET) in which complementary pairs of n-type and p-type transistors are stacked either monolithically sequentially. The ToT 3Di approach applicable herein expands such a concept thang two sets of CFET are stacked on top of each other, which can be illustrated in FIG. 1C.

For example, as shown in FIG. 1A, a semiconductor device 100A can include a n-type field-effect transistor 100_1 and a p-type field-effect transistor 100_2 that are positioned over a substrate 102 side by side. The n-type field-effect transistor 100_1 can include a channel structure 104 that includes one or more nano-sheets arranged along a horizontal direction (e.g., Y direction). The p-type field-effect transistor 100_2 can include a channel structure 106 that includes one or more nano-sheets arranged along the horizontal direction (e.g., Y direction). A common gate structure 108 can be formed to around the channel structures 104 and 106. In addition, power rails 110 can be formed over the common gate structure 108 and configured to provide operation voltages to the n-type field-effect transistor 100_1 and the p-type field-effect transistor 100_2. In FIG. 1B, a CFET device 110B can be formed over a substrate 112. The CFET device 110B can include a p-type field-effect transistor 100_4 and a n-type field-effect transistor 100_3 that are stacked over the substrate 112. The p-type field-effect transistor 100_4 can have a channel structure 116 positioned over a channel structure 114 of the n-type field-effect transistor 100_3. A common gate structure 113 can be positioned over the substrate 112 and around the channel structures 114 and 116. Power rails 118 can be positioned over the common gate structure 113 and disposed in the substrate 112 so as to be coupled to the p-type field-effect transistor 100_4 and the n-type field-effect transistor 100_3. In FIG. 1C, two CFET devices 100_5 and 100_6 can be stacked over a substrate 120. Each of the CFET devices 100_5 and 100_6 can include a respective n-type field-effect transistor and a respective p-type field-effect transistor that are stacked over each other. For example, the CFET device 100_5 can include a first n-type field-effect transistor stacked over a first p-type field-effect transistor. The first n-type field-effect transistor can include a channel structure 124 positioned over a channel structure 122 of the first p-type field-effect transistor. A first common gate structure 130 can be formed to around the channel structures 122 and 124. The CFET device 100_6 can include a second p-type field-effect transistor stacked over a second n-type field-effect transistor. The second p-type field-effect transistor can include a channel structure 128 positioned over a channel structure 126 of the second n-type field-effect transistor. A second common gate structure 132 can be formed to around the channel structures 126 and 128. Further, interconnect contacts 134 can be formed over the second common gate structure 132. An insulating structure 138 can be arranged between the CFET device 100_5 and the CFET device 100_6. Power rails 136 can be positioned within the substrate 120.

As illustrated in FIGS. 2A, 2B and 2C, CFET can improve a transistor density in standard cell logic designs by reducing the height of the standard cell, effectively by folding the "p half" of the standard cell over (on top of) the "n half." FIG. 2A shows a layout of a standard cell logic design, where a plurality of p-type transistors 202 can be positioned with a plurality of n-type transistors 204 side by side. A plurality of contacts 206-214 can be connected to input and output signals. For example, the contacts 206, 208, 210, and 212 can be connected to input signals A1, A2, B1, and B2 respectively, and the contact 214 can be connected to an output signal Z. In FIG. 2B, the "p half" 202 can be folded over the "n half" 204. Accordingly, contacts 216, 218, 220, and 222 can be connected to the input signals A1, A2, B1, and B2 respectively, and the contact 224 can be connected to the output signal Z.

As shown in FIG. 2C, stacked CFET can further improve the transistor density by reducing the width of the standard cell by effectively folding the cell in FIG. 2B left-over-right. Accordingly, contacts 226, 228, 230, and 232 can be connected to the input signals A1, A2, B1, and B2 respectively, and the contact 234 can be connected to the output signal Z. A well-known challenge in ToT 3Di is the increased wiring congestion caused by connecting a same number of input and output signals as well as internal signal connections, which can be shown in FIG. 2C with a substantially reduced footprint area.

Techniques herein provide a construct (i.e., a layout structure with a specific function) and associated integration solution to facilitate critical connections in stacked CFET 3Di while minimizing the impact on sparse wiring resources. More specifically, upwards of 40% of a logic block's area is occupied by sequential cells, i.e., not combinatorial cells that execute Boolean logic, but cells that store the intermediate states of logic paths in-between clock cycles. Therefore, the area scaling of logic designs is dominated by the efficiency with which sequential logic cells, such as flip-flops and latches, can be scaled. Techniques herein provide a construct to efficiently scale these types of data storage elements.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a first pair of field-effect transistors formed over a substrate and a second pair of field-effect transistors stacked over the first pair of field-effect transistor. The first pair of field-effect transistors can include a first field-effect transistor positioned over the substrate and a second field-effect transistor stacked over the first field-effect transistor. The second pair of field-effect transistors can include a third field-effect transistor stacked over the second field-effect transistor and a fourth field-effect transistor stacked over the third field-effect transistor. In the semiconductor device, a bottom gate structure can be disposed around a first channel structure of the first field-effect transistor and positioned over the substrate. An intermediate gate structure can be disposed over the bottom gate structure and around a second channel structure of the second field-effect transistor and a third channel structure of the third field-effect transistor. A top gate structure can be disposed over the intermediate gate structure and around a fourth channel structure of the fourth field-effect transistor. An inter-level contact can be formed to bypass the intermediate gate structure from a first side of the intermediate gate structure, and arranged between the bottom gate structure and the top gate structure.

In the semiconductor device, the first channel structure can be disposed in a horizontal direction parallel to a top surface of the substrate. The second channel structure can be disposed over the first channel structure in the horizontal direction. The third channel structure can be disposed over the second channel structure in the horizontal direction, and the fourth channel structure can be disposed over the third channel structure in the horizontal direction.

In some embodiments, the first side of the intermediate gate structure can extend less than a first side of the top gate structure and a first side of the bottom gate structure from a central axis of the first channel structure, the second channel structure, the third channel structure, and the fourth channel structure. A first side of the second channel structure and a first side of the third channel structure can extend less than a first side of the first channel structure and a first side of the fourth channel structure from the central axis.

In the semiconductor device, the top gate structure and the bottom gate structure can be connected to each other through the inter-level contact.

In some embodiments, a second side of the top gate structure can extend less than a second side of the intermediate gate structure and a second side of the bottom gate structure from the central axis.

The semiconductor device can further include an interconnect contact that extends from the intermediate gate structure and bypasses the top gate structure from the second side of the top gate structure.

The semiconductor device can include a dielectric liner that is formed along the first side of the intermediate gate structure, and positioned between the top gate structure and the bottom gate structure and around the inter-level contact.

In some embodiments, a first conductive plane can extend along the first sides of the bottom gate structure, the intermediate gate structure and the top gate structure, and span a height of the first pair of field-effect transistors and the second pair of field-effect transistors. A second conductive plane can extend along the second sides of the bottom gate structure, the intermediate gate structure and the top gate structure, and span the height of the first pair of field-effect transistors and the second pair of field-effect transistors. The first conductive plane can be coupled to one of the first pair of field-effect transistors and the second pair of field-effect transistors, and the second conductive plane can be coupled to one of the first pair of field-effect transistors and the second pair of field-effect transistors.

In some embodiments, each of the first channel structure, the second channel structure, the third channel structure, and the fourth channel structure can include one or more respective nanosheets that are disposed in the horizontal direction, stacked over one another, and spaced apart from one another.

In the semiconductor device, the bottom gate structure can include a bottom dielectric stack around the first channel structure, a bottom work function stack around the bottom dielectric stack, and a bottom gate electrode around the bottom work function stack. The intermediate gate structure can include a first intermediate dielectric stack around the second channel structure and a second intermediate dielectric stack around the third channel structure, a first intermediate work function stack around the first intermediate dielectric stack, a second intermediate work function stack around the second intermediate dielectric stack, and an intermediate gate electrode around the first intermediate work function stack and the second intermediate work function stack. The top gate structure can include a top dielectric stack around the fourth channel structure, a top work function stack around the top dielectric stack, and a top gate electrode around the top work function stack.

The semiconductor device can further include a first dielectric cap layer positioned between the bottom gate structure and the intermediate gate structure, and a second dielectric cap layer positioned between the intermediate gate structure and the top gate structure.

In some embodiments, the first field-effect transistor can be one of a n-type field-effect transistor or a p-type field-effect transistor. The second field-effect transistor can be one of a n-type field-effect transistor or a p-type field-effect transistor. The third field-effect transistor can be one of a n-type field-effect transistor or a p-type field-effect transistor, and the fourth field-effect transistor can be one of a n-type field-effect transistor or a p-type field-effect transistor.

According to another aspect of the disclosure, a method for manufacturing a semiconductor device is provided. In the method, a first channel structure can be formed over a substrate, a second channel structure can be formed over the first channel structure, a third channel structure can be formed over the second channel structure, and a fourth channel structure can be formed over the third channel structure. A bottom gate structure can be formed around the first channel structure. Further, an intermediate gate structure can be formed around the second channel structure and the third channel structure. A first etching process can be performed subsequently to remove a portion of the intermediate gate structure from a first side of the intermediate gate structure so that a portion of the bottom gate structure is uncovered. An inter-level contact can be formed to extend from the uncovered portion of the bottom gate structure and bypass the intermediate gate structure from the first side of the intermediate gate structure. A top gate structure can be disposed over the intermediate gate structure such that the inter-level contact is positioned between the bottom gate structure and the top gate structure.

In the method, a first dielectric cap layer can be formed between the bottom gate structure and the intermediate gate structure. A second dielectric cap layer can be formed between the intermediate gate structure and the top gate structure.

In some embodiments, the first side of the intermediate gate structure can extend less than a first side of the top gate structure and a first side of the bottom gate structure from a central axis of the first channel structure, the second channel structure, the third channel structure, and the fourth channel structure. A first side of the second channel structure and a first side of the third channel structure can extend less than a first side of the first channel structure and a first side of the fourth channel structure from the central axis.

In the method, a second etching process can be performed to remove a portion of the top gate structure from a second side of the top gate structure so that a portion of the intermediate gate structure is uncovered from a second side of the intermediate gate structure. An interconnect contact can be further formed to extend from the uncovered portion of the intermediate gate structure and bypass the top gate structure from the second side of the top gate structure.

In some embodiments, each of the first channel structure, the second channel structure, the third channel structure, and the fourth channel structure can include one or more respective nanosheets that are disposed in a horizontal direction parallel to a top surface of the substrate, stacked over one another, and spaced apart from one another.

In the method, a dielectric liner can be positioned along the first side of the intermediate gate structure, where the dielectric liner can be positioned between the intermediate gate structure and the inter-level contact and around the inter-level contact.

In some embodiments, the bottom gate structure can include a bottom dielectric stack around the first channel structure, a bottom work function stack around the bottom dielectric stack, and a bottom gate electrode around the bottom work function stack. The intermediate gate structure can include a first intermediate dielectric stack around the second channel structure and a second intermediate dielectric stack around the third channel structure, a first intermediate work function stack around the first intermediate dielectric stack, a second intermediate work function stack around the second intermediate dielectric stack, and an intermediate gate electrode around the first intermediate work function stack and the second intermediate work function stack. The top gate structure can include a top dielectric stack around the fourth channel structure, a top work function stack around the top dielectric stack, and a top gate electrode around the top work function stack.

In the method, a first conductive plane can be formed to extend along the first sides of the bottom gate structure, the intermediate gate structure and the top gate structure, and span a height from the substrate to the fourth channel structure. A second conductive plane can be formed to extend along the second sides of the bottom gate structure, the intermediate gate structure and the top gate structure, and span the height from the substrate to the fourth channel structure. In addition, the first conductive plane can be coupled to one of the bottom gate structure, the intermediate gate structure, and the top gate structure, and the second conductive plane can be coupled to one of the bottom gate structure, the intermediate gate structure, and the top gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic view of a n-type transistor and a p-type transistor arranged side by side, in accordance with some embodiments.

FIG. 1B is a schematic view of a complementary FET (CFET) device, in accordance with some embodiments.

FIG. 1C is a schematic view of a first CFET device stacked over a second CFET device, in accordance with some embodiments.

FIG. 4 is a layout view of a semi-dynamic flip-flop circuit based on stacked CFET devices, in accordance with some embodiments.

FIG. 5A is an expanded layout view of the semi-dynamic flip-flop circuit based on the stacked CFET devices, in accordance with some embodiments.

FIGS. 5B and 5C are expanded cross-sectional views of the layout of the semi-dynamic flip-flop circuit based on the stacked CFET devices, in accordance with some embodiments.

FIGS. 6-23 are cross-sectional views of various intermediate steps in a manufacturing flow to fabricate a semi-dynamic flip-flop circuit based on stacked CFET devices, in accordance with some embodiments.

DETAILED DESCRIPTION

Figure 2A:
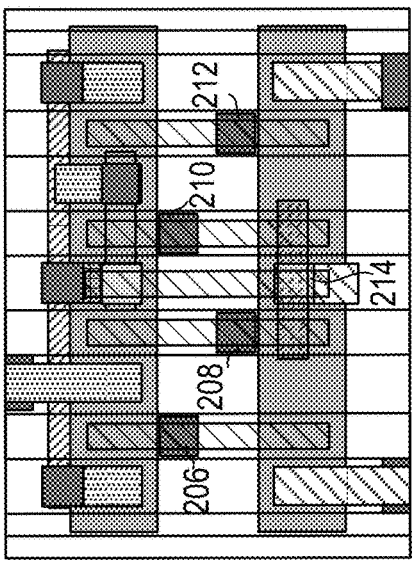
FIG. 2A is a layout view of a n-type transistor and a p-type transistor arranged side by side, in accordance with some embodiments.
Figure 2B:
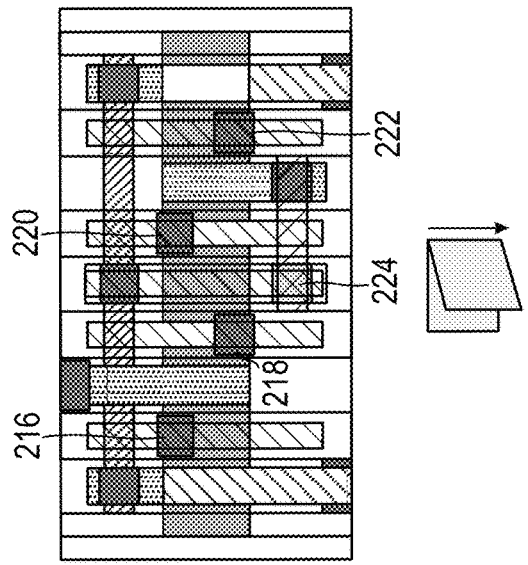
FIG. 2B is a layout view of a CFET device, in accordance with some embodiments.
Figure 2C:
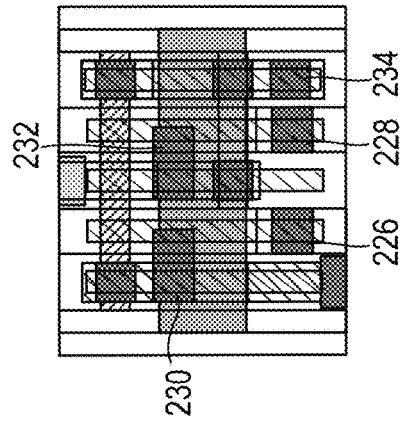
FIG. 2C is a layout view of a first CFET device stacked over a second CFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

A critical component of all latches and flip-flops is a pair of cross-coupled transistors, commonly referred to as cross-couple (XC) for short. A semi-dynamic flip-flop (SDFF) circuit that contains three sets of XC can be used as an example to illustrate techniques herein. Wiring XC efficiently and reliably has long been a major priority and significant challenge for design-technology co-optimization (DTCO). Thus, various related examples exist on 2D implementations of XC. The present disclosure provides embodiments with a highly efficient means of stacking and connecting pairs of XC based on a stacked CFET technology.

Figure 3:
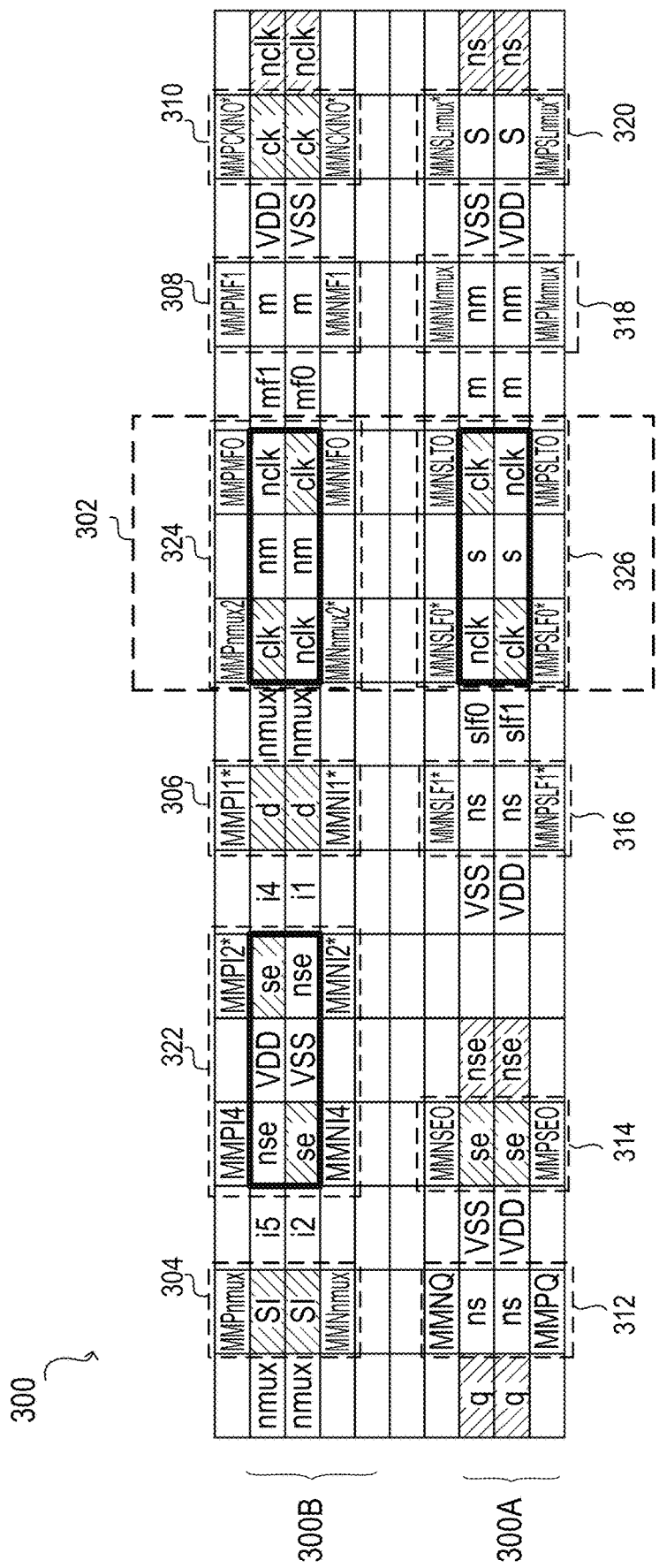
FIG. 3 is a diagram of a transistor placement for a semi-dynamic flip-flop circuit based on stacked CFET devices, in accordance with some embodiments.

As FIG. 3 illustrates, flip-flop circuits are highly complex circuit designs. In an exemplary embodiment of FIG. 3, a semi-dynamic flip-flop circuit 300 can be formed of 30 transistors that include nine complementary pairs using common-gate connections and three sets of XC with four transistors each. FIG. 3 shows a preferred transistor placement for a stacked CFET implementation, placing critical inter-level connections in close proximity. More specifically, FIG. 3 illustrates a transistor placement in which the complementary pairs of XC used in the semi-dynamic flip-flop circuit are stacked vertically on top of each other. Further illustrated in FIG. 3 is the preferred vertical order of the transistor placement: p-n-n-p (or p-type transistor/n-type transistor/n-type transistor/p-type transistor) in the stacked CFET implementation. Reversing the order of the top CFET stack can also facilitate the direct inter-level connectivity. For example, a transistor placement of n-p-p-n (or n-type transistor/p-type transistor/p-type transistor/n-type transistor) can be applied in the stacked CFET implementation. In FIG. 3, an area of interest 302 can be shown with enlarged views in FIGS. 5A, 5B, 5C and 5D.

Still referring to FIG. 3, the semi-dynamic flip-flop circuit 300 can be formed of nine complementary pairs (or nine CFET devices) 304-320 using common-gate connections and three sets of XC 322-326 with four transistors each. For example, the complementary pair (or CFET device) 304 can include a p-type transistor MMPnmux stacked over a n-type transistor MMNnmux. A gate of the p-type transistor MMPnmux and a gate of the MMNnmux are connected to each other and further connect to a node of SI. A first source/drain (S/D) of the p-type transistor MMPnmux is connected to a node of nmux, and a second S/D of the p-type transistor MMPnmux is connected to a node of i5. A first source/drain (S/D) of the n-type transistor MMNnmux is connected to the node of nmux, and a second S/D of the n-type transistor MMNnmux is connected to a node of i2. The XC 322 includes a first p-type transistor MMPI4 over a first n-type transistor MMNI4, and a second p-type transistor MMPI2* stacked over a second n-type transistor MMNI2*. The first p-type transistor MMPI4 is cross-coupled to the second n-type transistor MMNI2* in that both gates of the first p-type transistor MMPI4 and the second n-type transistor MMNI2* are connected to a same node of nse. The second p-type transistor MMPI2* is cross-coupled to the first n-type transistor MMNI4 in that both gates of the second p-type transistor MMPI2* and the first n-type transistor MMNI4 are connected to a same node of se. The area of interest 302 includes a XC 324 that is stacked over a XC 326. A detailed description of the area of interest 302 can be illustrated in FIGS. 5A, 5B, 5C, and 5D.

The CFET devices in FIG. 3 can be arranged in a first device layer 300A and a second device layer 300B. The first device layer 300A can be formed over a substrate, and the second device layer 300B can be stacked over the first device layer 300A. The first device layer 300A can include the CFET device of 312, 314, 316, 318, 320, and the XC 326. The second device layer 300B can include the CFET device 304, 306, 308, 310, the XC 322, and the XC 324.

Figure 4:
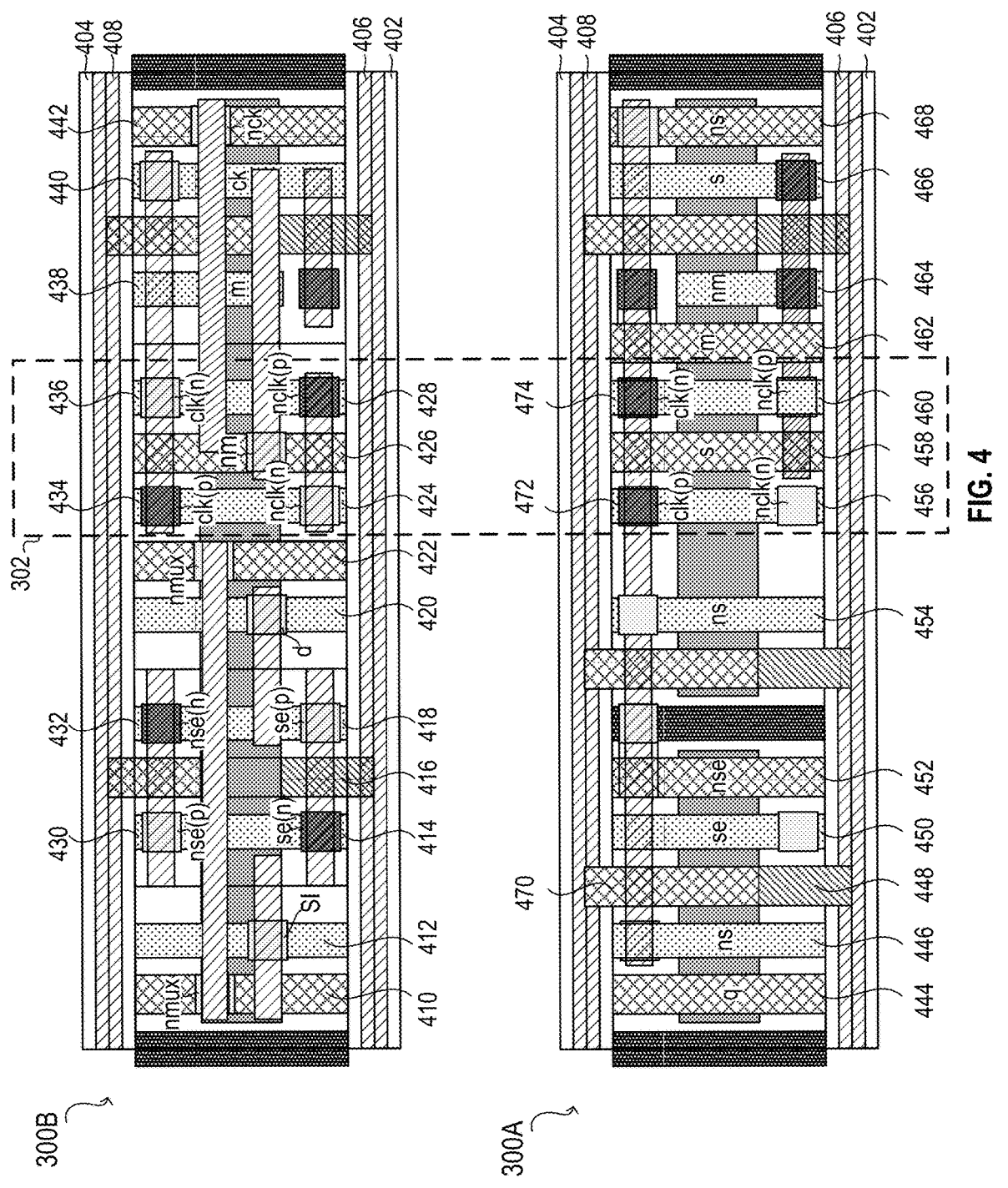

FIG. 4 shows a preferred layout for the preferred transistor placement of FIG. 3. As the density of specific lines indicates, and as mentioned above, wiring congestion is a major challenge for dense ToT 3Di. To prevent the wiring congestion from impacting area scaling, it is vital to connect highly used circuit elements, like the XC, with minimal use of wiring tracks. An example embodiment can be illustrated in FIG. 5.

In FIG. 4, the layout of SDFF based on the stacked CFET implementation is illustrated. For clarity, the two levels of CFET design 300A and 300B are shown as separate layouts. The area of interest 302 which is the stacked pair of XC, is framed by dashed lines. As shown in FIG. 4, the second level (or second device layer) 300B of the SDFF can include a plurality of gate structures 412, 420, 438, and 440, which are in accordance with the gate structures of the CFET devices 304, 306, 308, and 310 respectively. The second level (or device layer) 300B of the SDFF can also include gate structures 430, 432, 414, and 418, which are in accordance with the gate structures of the XC 322. The second level (or device layer) 300B of the SDFF can also include gate structures 424, 428, 434, and 436 that are in accordance with the gate structures of the XC 324. The second level (or second device layer) 300B of the SDFF can also include a plurality of S/D regions, such as 410, 416, 422, 426, 442. Each of the S/D regions can be in accordance with a respective CFET device of a respective XC. For example, the S/D region 410 can be the S/D regions of the CFET device of 304 coupled to the node of nmux. The S/D region 422 can be the S/D regions of the CFET device 306 coupled to the node of nmux. The S/D region 426 can be the S/D regions of the XC 324 coupled to the node of nm.

Similarly, the first level (or first device layer) 300A of the SDFF can include gate structures 446, 450, 454, 464, and 466 that are in accordance with the CFET devices 312, 314, 316, 318, and 320 respectively. The first level 300A can also include gate structures 456, 460, 472, and 474 that are in accordance with the XC 326. The first level 300A can include S/D regions, such as 444, 448, 470, 452, 458, 462, and 468. The S/D regions can be the S/D of the CFET devices or the XC. For example, the S/D region 444 can be the S/D regions of the CFET device 312. The S/D region 458 can be the S/D of the XC 326. The SDFF can further include a first power rail 402 extending along a first side of the SDFF and a second power rail 404 extending along a second side of the SDFF. The SDFF can also include a first power wall (or conductive plane) 406 positioned over the first power rail 402, and a second power wall (or conductive plane) 408 positioned over the second power rail 404. The first and second power walls are configured to provide operation voltages to the CFET devices and XCs.

One example embodiment of techniques herein can be illustrated in FIG. 5, which shows an expanded view of the area of interest 302. The device and design includes several elements. One element is a common gate. A common gate, usually used to facilitate a single gate contact for two complementary n and p devices, is used to allow a single input to both an upper gate (or top gate) of the bottom CFET and a lower gate (or bottom gate) of the top CFET in the stacked XC pair. Alternatively, an inter-level contact can be used to strap the two center gates of the bottom CFET and the top CFET together to allow a single contact in the wiring congested plane above the device stack. A series of gate cut constructs can be included that shorten the two center gates on one end (e.g., left end in FIG. 5B) while shortening the upper gate on the opposite end (e.g. right end in in FIG. 5B). An inter-level super-contact (or inter-level contact) can be subsequently formed that straps the upper gate to the bottom gate bypassing the two intermediate gates (or two center gates).

As shown in FIG. 5, a stacked pair of XC can be formed in a stacked CFET configuration with a minimal use of local wiring. FIG. 5A is a top down view of the layout including the XC 324 in the second device layer 300B and the XC 326 in the first device layer 300A. FIG. 5B is a cross-sectional view of the XC 324 and XC 326 obtained from a plane same as the vertical plane containing line A-A' in FIG. 5A. FIG. 5C is a cross-sectional view of the XC 324 and XC 326 obtained from a plane same as the vertical plane containing line B-B' in FIG. 5A. As shown in FIG. 5B, in order to obtain the minimal use of local wiring in the stacked CFET configuration, a common gate structure 504 can be formed around the channel structures 508 and 510 of the two center transistors MMNSLF0* and MMNnmux2* so that the two center transistors MMNSLF0* and MMNnmux2* are coupled to each other. In addition, a series of gate cut constructs can be applied to save the space of local wiring. For example, a left side (or first side) of the common gate structure 504 can extend less than a left side (or first side) of the upper gate structure 506 and a left side (or first side) of the bottom gate structure 502 from a center axis C-C' of the channel structures 508, 510, 512, and 514. Further, a right side (or second side) of the upper gate structure 506 can extend less than a right side (or second side) of the common gate structure 504 from the axis C-C'. An inter-level contact 516 can thus extend from the upper gate structure 506 and further bypass the common gate structure 504 from the first side of the common gate structure 504 to connect to the upper gate structure 506. In addition, an interconnect contact 518 can extend from the common gate structure 504, and bypass the upper gate structure 506 from the second side of the upper gate structure 506.

The same wiring configuration can be applied to wire the transistors MMPMF0, MMNMF0, MMNSLT0, and MMPSLT0 in FIG. 5C. As shown in FIG. 5C, a first side (or right side) of a common gate structure 522 can extend less from a central axis D-D' of the channel structures of transistors MMPMF0, MMNMF0, MMNSLT0, and MMPSLT0 than a first side (or right side) of the bottom gate structure 520 and a first side of the upper gate structure 524. An inter-level contact 526 can extend from the bottom gate structure 520 and further bypass the common gate structure 522 from the first side of the common gate structure 522 to connect to the upper gate structure 524. A second side (or left side) of the upper gate structure 524 can extend less from the central axis D-D' than the second side (or left side) of the common gate structure 522. An interconnect contact 528 can extend from the common gate structure 522 and further bypass the upper gate structure 524 from the second side of the upper gate structure 524.

Figure 6:
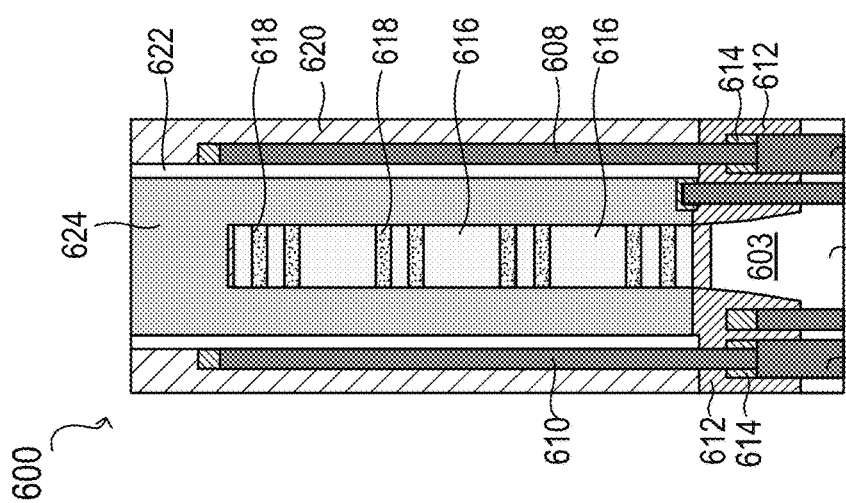

A preferred integration flow to enable the disclosed stacked XC configuration can be shown in FIGS. 6-23. For simplicity and clarity, the flow can be illustrated based on CFET devices with a two-nanosheet channel region. In FIG. 6, a semiconductor structure 600 can be formed. The semiconductor structure 600 can include a substrate 602. The substrate 602 can include silicon (Si), germanium (Ge), silicon carbide (SiC), silicon germanium (SiGe), or other suitable semiconductor materials. A fin structure 603 can extend from the substrate 602. A first power rail 604 can be formed a first side (or right side) of the fin structure 603 and further extend into the substrate 602. A second power rail 606 can be formed a second side (or left side) of the fin structure 603 and further extend into the substrate 602. A shallow trench isolation (STI) oxide 612 is positioned over the substrate 602 and arrange between the fin structure 603 and the first and second power rails 604 and 606. The first and second power rails 604 and 606 can be covered by a capping layer 614. The capping layer 614 can be made of a dielectric material or metal oxide. In an embodiment of FIG. 6, the capping layer can be AlO. The semiconductor structure 600 can include a first power wall (or conductive plane) 608 extending from the first power rail 604 and a second power wall 610 extending from the second power rail 606. Further, a plurality of first nanosheets 616 and a plurality of second nanosheets 618 can be alternately formed over the fin structure 603. The first nanosheets 616 and second nanosheets 618 can extend along a vertical direction (e.g., Z direction) perpendicular to the substrate 602 and further extend along a horizontal (e.g., Y direction) parallel to the substrate 602. In an exemplary embodiment of FIG. 6, the first nanosheets 616 can be made of SiGe or Ge. The second nanosheets 618 can be made of Si.

Still referring to FIG. 6, a dielectric layer 620 can be formed over the STI oxide 612. A low-k spacer 622 can be formed along sidewalls of the dielectric layer 620. The low-k spacer 622 can further be positioned between the first power wall 608 and the second power wall 610. Further, a spin-on carbon (SOC) layer 624 can be formed along sidewalls of the low-k spacer 622, where the SOC layer 624 is further disposed around the first nanosheets 616 and the second nanosheets 618. An example dielectric layer 620 can include SiOx, SiOxNy, SiCxNy, or the like. The low-k spacer 622 can be made of any low-k material, such as SiCOH. The first and second power rails 604 and 606, and the first and second power walls 608 and 610 can be made of tungsten, ruthenium, cobalt, copper, aluminum, or the like.

Figure 8:
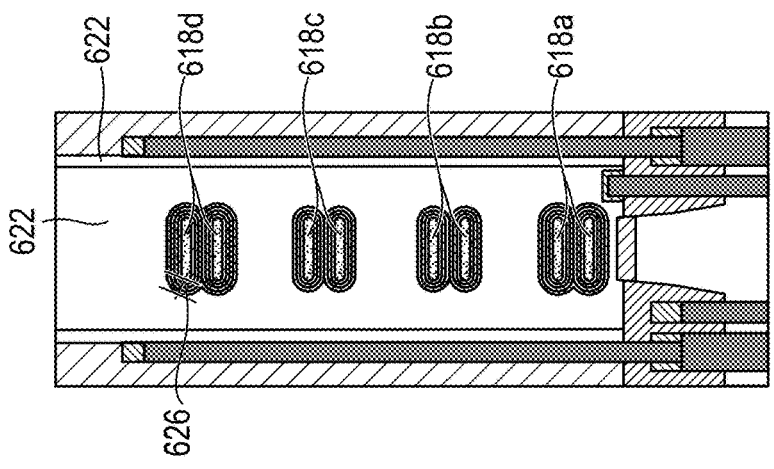
Figure 7:
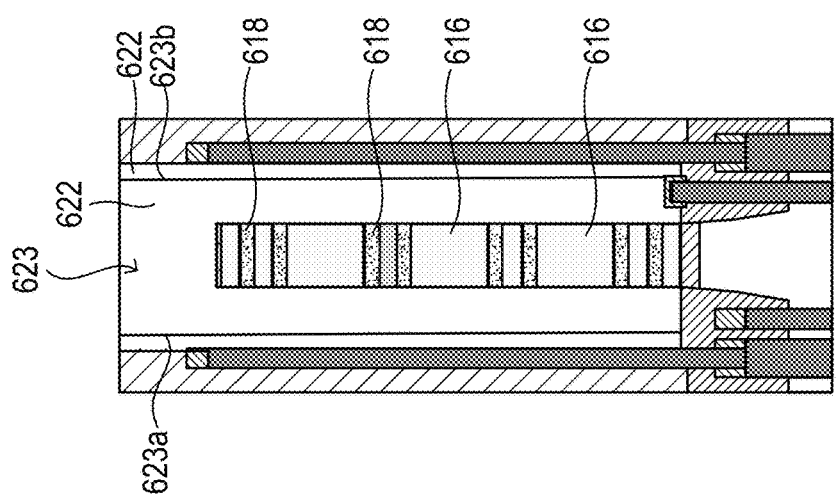

In FIG. 7, an etching process can be applied to remove the SOC layer 624 so that the first nanosheets 616 and the second nanosheets 618 can be uncovered. When the etching process is finished, a recessed region 623 can be formed that include a first side 623*a* and a second side 623*b*. In FIG. 8, a selective etching process can be applied to remove the first nanosheets 616 that are positioned between the second nanosheets 618. After the selective etching process, the second nanosheets 618 remain and function as channel structures 618. As shown in FIG. 8, the channel structures 618 can include a first channel structure (or bottom channel structure) 618*a*, a second channel structure 618*b* over the first channel structure 618*a*, a third channel structure 618*c* over the second channel structure 618*b*, and a fourth channel structure (or top channel structure) 618*d* over the third channel structure 618*c*. Further, a gate stack 626 can be formed around the channel structures 618. The gate stack 626 can include a dielectric stack around the channels structure 618, and a work function stack around the dielectric stack. For example, the dielectric stack can include a SiO layer around the channel structures 618, and a high-k layer around the SiO layer. The high-k layer can include $HfO_2$, $ZrO_2$, $HfSiNO_2$, $ZrSiNO_2$, $Y_2O_3$, $Y_3O_4$, $Si_3N_4$, TiO2, HfZrO, $Ta_2O_3$, $HfSiO_4$, $ZrSiO_2$, LaO, AlO, ZrO, TiO, $Ta_2O_5$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, Oxynitrides (SiON), combinations thereof, or other suitable material. The work function stack can include TiN, TaN, TiC, TiON, AlTiN, AlTiC, AlTiO, the like, or the combination thereof.

Figure 9:
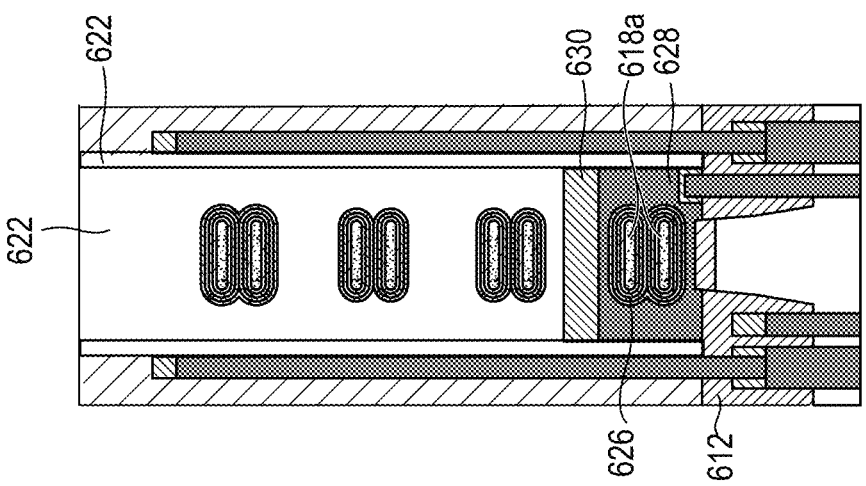

In FIG. 9, after the dummy gate pull and work-function metal deposition shown in FIG. 8, a bottom gate (or bottom gate electrode) 628 can be metalized and further capped with a first dielectric insulator (or first dielectric cap layer) 630. As shown in FIG. 9, the bottom gate electrode 628 can be formed around the bottom channel structure 618*a* and positioned over the STI oxide 612. In some embodiments, the bottom gate electrode 628 can be made of tungsten, ruthenium, cobalt, or the like. The first dielectric insulator 630 can be made of any suitable dielectric material, such as SiN. The bottom gate electrode 628 and the first dielectric insulator 630 can be deposited by a suitable deposition process, such as chemical vapor deposition (CVD), physical vapor deposition (PVD), atomic layer deposition (ALD), thermal oxidation, e-beam evaporation, sputtering, diffusion, or any combination thereof.

Figure 11:
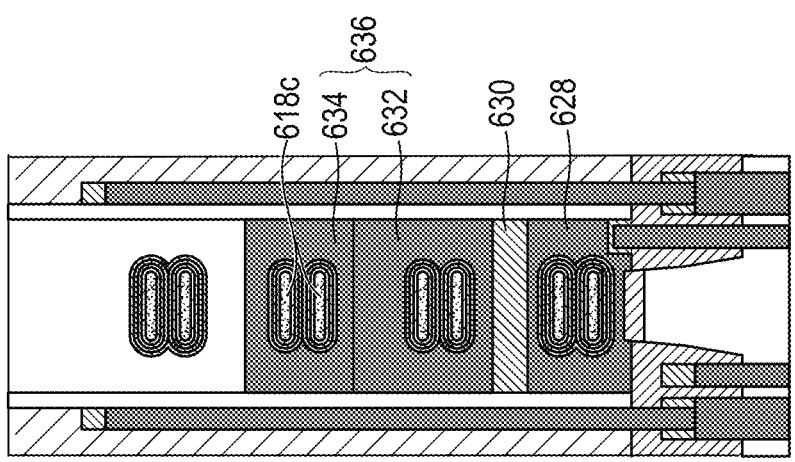
Figure 10:
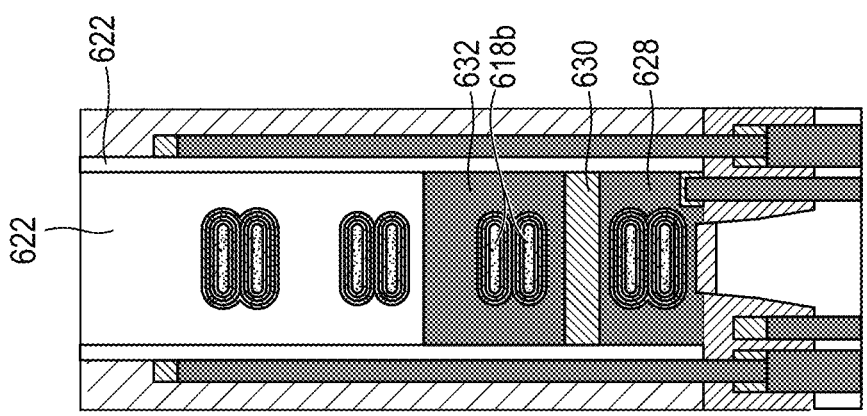

In FIG. 10, a second gate electrode 632 can be formed around the second channel structure 618*b*. In FIG. 11, a third gate electrode 634 can be formed around the third channel structure 618*c*. The second gate electrode 632 and the third gate electrode 634 can be made of a same conductive material and function as a common gate (or common gate electrode, or intermediate gate electrode) 636.

Figure 12:
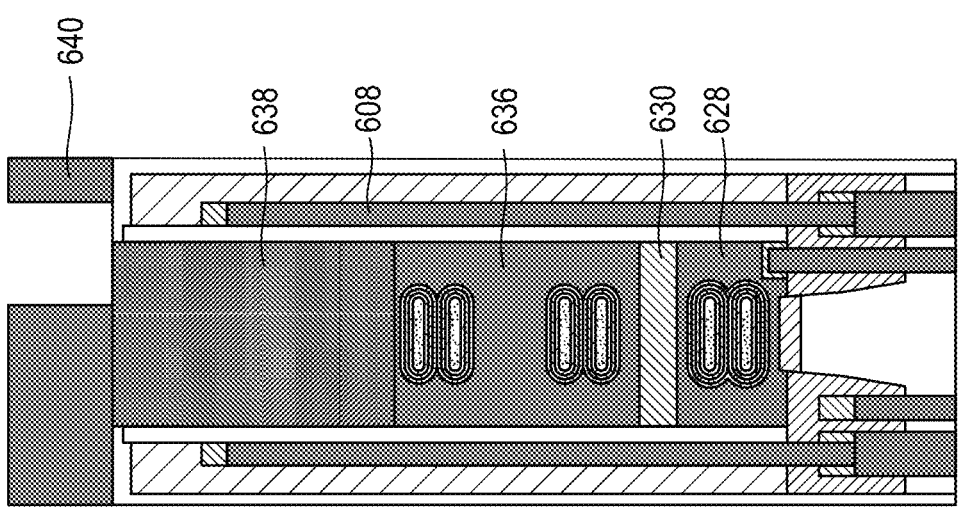

In FIG. 12, a protective cap 638 can be placed over the common gate electrode 636 to cover the top channel structure 618*d*, and a patterned mask 640 can be positioned over the protective cap 638. The patterned mask 640 can reveal (or uncover) a portion of the protective cap 638 from a right side of the protective cap 638 adjacent to the first power wall 608. In an exemplary embodiment of FIG. 12, the protective cap 638 can be made of SOC. The patterned mask 640 can be formed through a photolithography process which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combination thereof.

Figure 13:
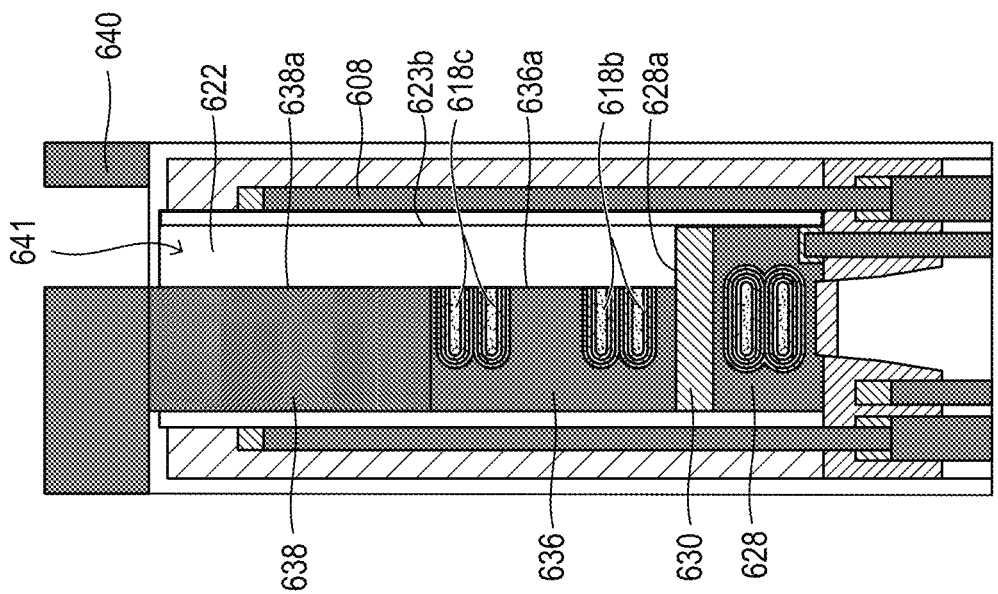

In FIG. 13, an etching process can be applied to transfer the patterns in the patterned mask 640. The etching process can remove the portion of the protective cap 638 that is uncovered. The etching process can further remove a portion of the common gate electrode 636 that is adjacent to the first power wall 608. In some embodiments, portions of the second channel structure 618*b* and the third channel structure 618*c* can also be removed. When the etching process is completed, a portion of the first dielectric insulator 630 adjacent to the first power wall 608 can be uncovered. Further, an endcap region 641 can be formed. The endcap region 641 can be an open space that is defined by an edge 638*a* of the protective cap 638, a first side 636*a* of the common gate electrode 636, a top surface 628*a* of the bottom gate electrode 628, and the second side 623*b* of the recessed region 623 which is mentioned in FIG. 7.

In FIG. 14, the uncovered portion of the first dielectric insulator 630 can further be removed to expose the bottom gate electrode 628. In FIG. 15, a plasma ashing process can be applied to remove the patterned mask 640.

Figure 16:
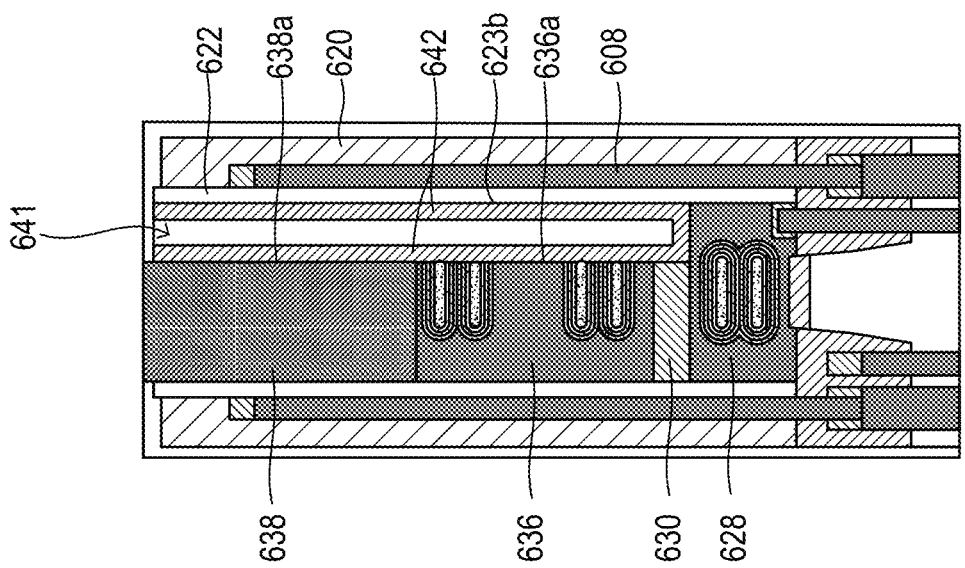

As shown in FIG. 16, a dielectric liner 642 can be deposited conformally in the exposed endcap region 641. As shown in FIG. 16, the dielectric liner 642 can be conformally deposited along the edge 638*a* of the protective cap 638, the first side 636*a* of the common gate electrode 636, the top surface 628*a* of the bottom gate electrode 628, and the second side 623*b* of the recessed region 623.

Figure 18:
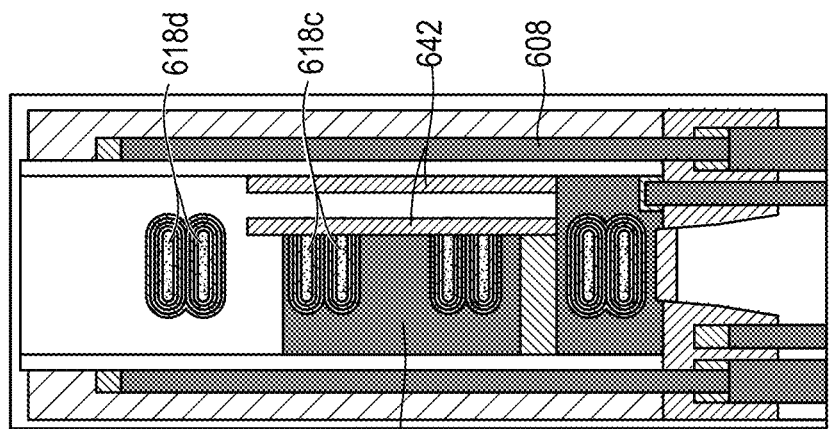
Figure 17:
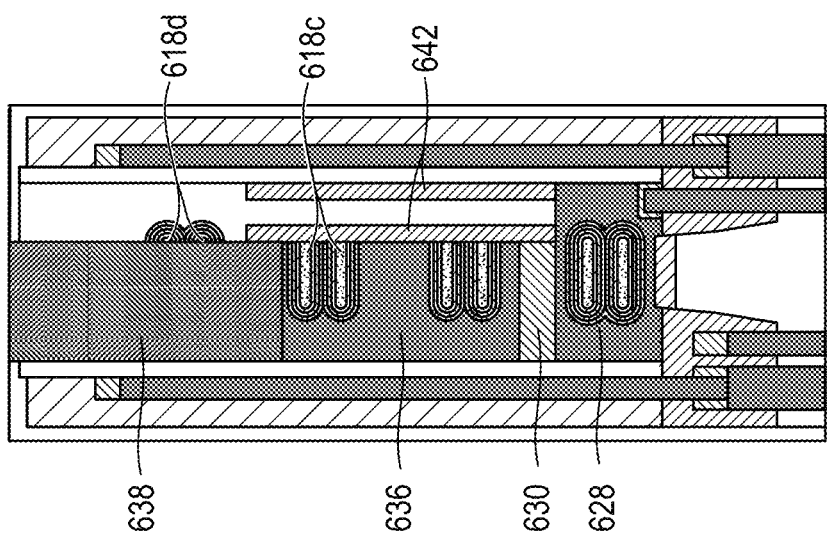

In FIG. 17, the dielectric liner 642 can be etched back to a plane between the top channel structure 618*d* and the third channel structure 618*c*. At the same time, a bottom portion of the dielectric liner 642 that is positioned over the top surface 628*a* of the bottom gate electrode 628 can be also removed, which results in exposing the bottom gate electrode 628. In FIG. 18, the protective cap 638 positioned over the common gate electrode 636 can be removed by an etching process or a plasma ash process.

Figure 19:
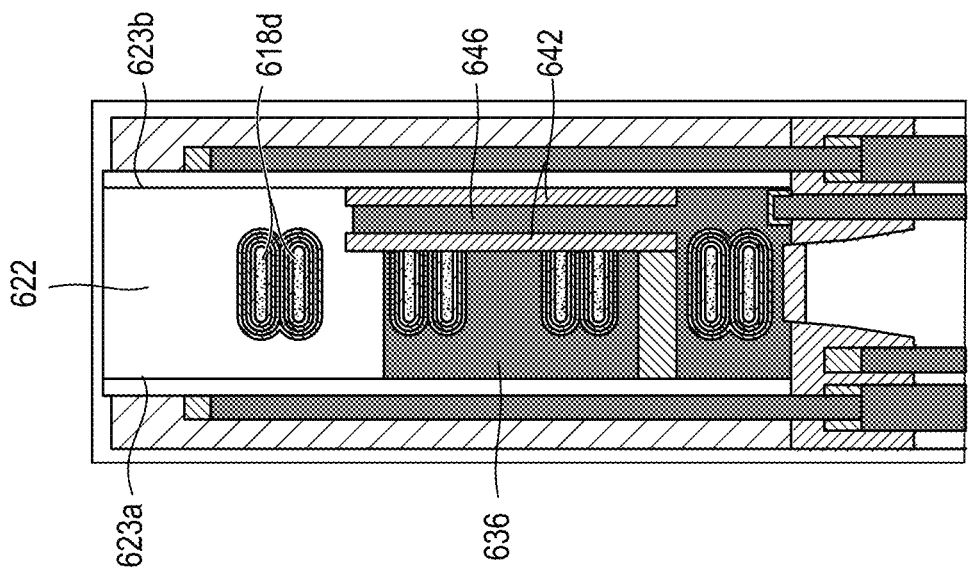

In FIG. 19, the exposed endcap region 641 can be metalized, forming a conductive path to the bottom gate electrode 628. As shown in FIG. 19, a conductive layer 644 can be formed along the first side 623*a* and the second side 623*b* of the recessed region 623, and positioned on the common gate electrode 636. The conductive layer 644 can further extend through the dielectric liner 642 to be in contact with the bottom gate electrode 628. The conductive layer 644 can further be disposed around the top channel structure 618*d*. The conductive layer 644 can include a first portion 644*a* that is surrounded by the dielectric liner 642, and a second portion 644*b* that is arranged along the first side 623*a* and the second side 623*b* of the recessed region 623, and positioned on the common gate electrode 636. The conductive layer 644 can be deposited by any suitable deposition process, such as chemical vapor deposition (CVD), physical vapor deposition (PVD), atomic layer deposition (ALD), thermal oxidation, e-beam evaporation, sputtering, diffusion, or any combination thereof.

Figure 20:
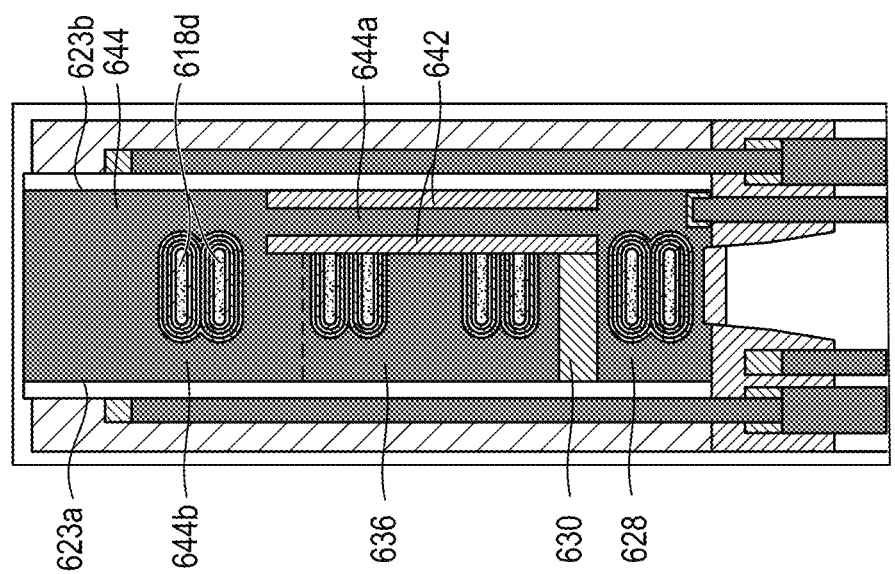

In FIG. 20, the second portion 644*b* of the conductive layer 644 can be removed so that the top channel structure 618*d* can be uncovered. The first portion 644*a* of the conductive layer 644 can still remain and function as an inter-level contact 646.

Figure 21:
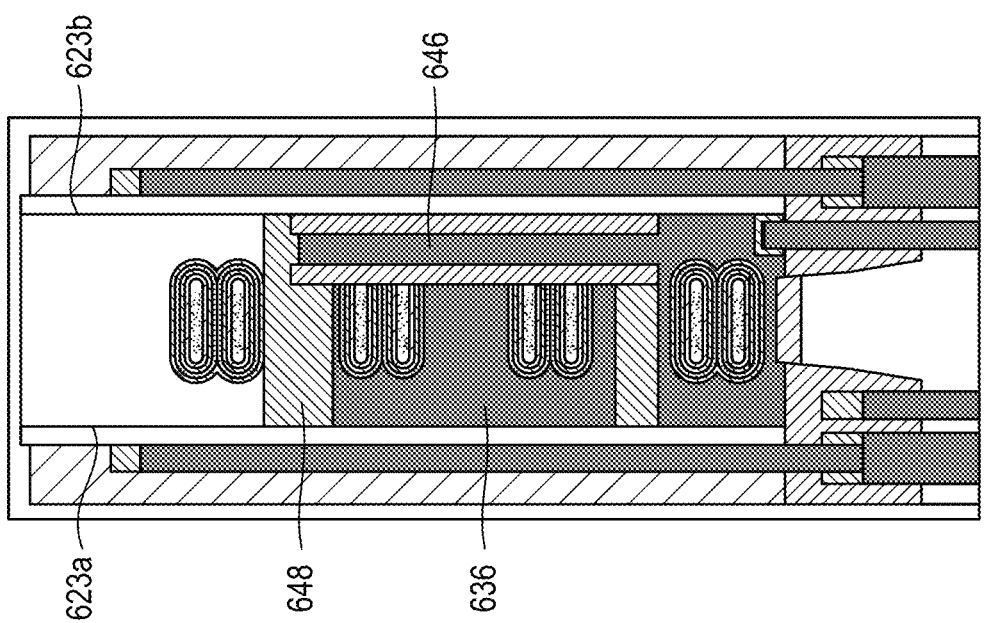

In FIG. 21, a dielectric cap 648 can be deposited over the common gate electrode 636. The dielectric cap 648 can further be deposited over the inter-level contact 646.

Figure 22:
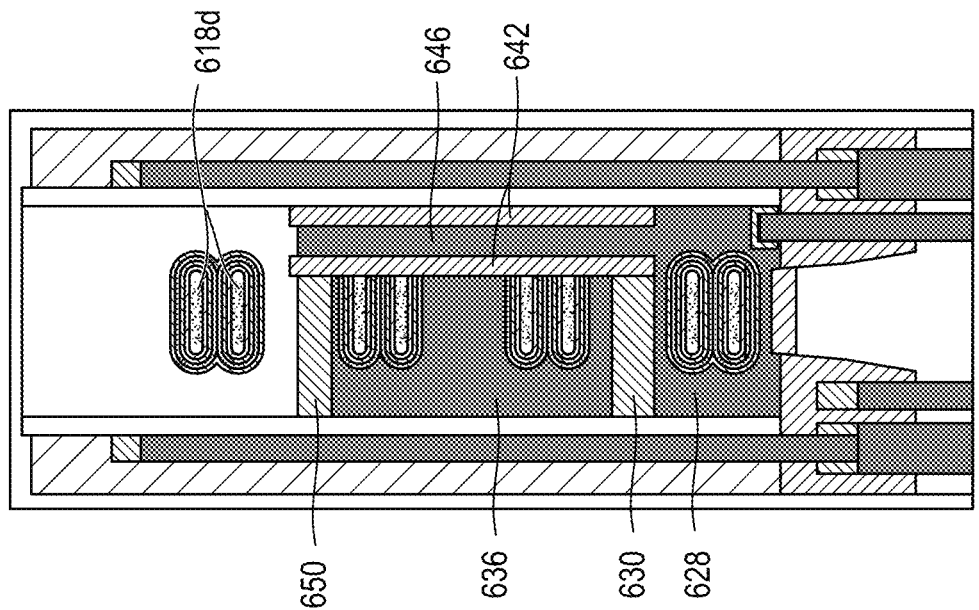

In FIG. 22, the dielectric cap 648 can be etched back so that the inter-level contact 646 can be uncovered. The remaining dielectric cap 648 can become a second dielectric insulator (or second dielectric cap layer) 650.

Figure 23:
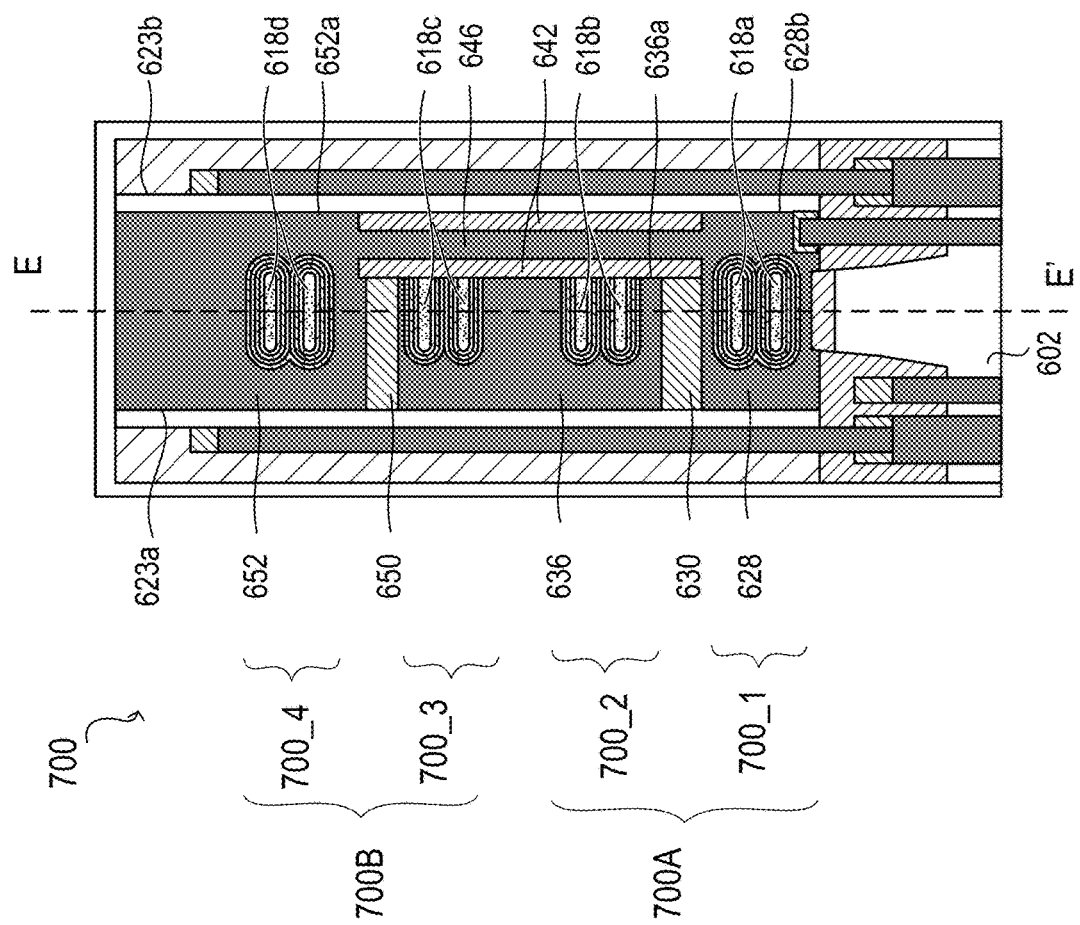

In FIG. 23, a top gate electrode 652 can be formed along the first side 623a and the second side 623b of the recessed region 623, and positioned on the second dielectric insulator 650. When the top gate electrode 652 is completed, a semiconductor device 700 is formed based on stacked CFET devices with the minimal use of local wiring in the stacked CFET configuration. As shown in FIG. 23, the semiconductor device 700 can include a first pair of field-effect transistors 700A formed over the substrate 602. The first pair of field-effect transistors 700A can include a first field-effect transistor 700_1 positioned over the substrate 602 and a second field-effect transistor 700_2 stacked over the first field-effect transistor 700_1. A second pair of field-effect transistors 700B stacked over the first pair of field-effect transistor 700A. The second pair of field-effect transistors 700B can include a third field-effect transistor 700_3 stacked over the second field-effect transistor 700_2 and a fourth field-effect transistor 700_4 stacked over the third field-effect transistor 700_3. A bottom gate electrode 628 is disposed around the first channel structure 618a of the first field-effect transistor 700_1 and positioned over the substrate 602. An intermediate gate electrode (or common gate electrode) 636 is disposed over the bottom gate electrode 628 and around the second channel structure 618b of the second field-effect transistor 700_2 and the third channel structure 618c of the third field-effect transistor 700_3. The top gate electrode is disposed over the intermediate gate electrode 636 and around the fourth channel structure 618d of the fourth field-effect transistor 700_4. The inter-level contact 646 is formed to bypass the intermediate gate electrode 636 from the first side 636a of the intermediate gate electrode 636, and arranged between the bottom gate electrode 628 and the top gate electrode 652.

Still referring to FIG. 23, the first side 636a of the intermediate gate electrode 636 extends less than a first side 652a of the top gate electrode 652 and a first side 628b of the bottom gate electrode 628 from a central axis E-E' of the first channel structure 618a, the second channel structure 618b, the third channel structure 618c, and the fourth channel structure 618d. Further, the first dielectric cap layer 630 is positioned between the bottom gate electrode 628 and the intermediate gate electrode 636 to isolate the bottom gate electrode 628 and the intermediate gate electrode 636 from each other. The second dielectric cap layer 650 is positioned between the intermediate gate electrode 636 and the top gate electrode 652 to isolate the intermediate gate electrode 636 and the top gate electrode 652 from one another. The dielectric liner 642 is formed along the first side 636a of the intermediate gate electrode 636 and further is disposed to surround the inter-level contact 646. Thus, the inter-level contact 646 is isolated from the intermediate gate electrode 636 by the dielectric liner 642.

In the semiconductor device 700 that is implemented based on the stacked CFET configuration, a minimal use of local wiring is obtained by introducing common gates (e.g., common gate electrode 636) and gate cut structures (e.g., common gate electrode 636 is cut from the first side). The gate cut structures allow the inter-level contact (e.g., 646) to strap the top gate electrode (e.g., 652) to the bottom gate electrode (e.g., 628) bypassing the common gate electrode.

As can be appreciated, many alternative flows can be used to achieve the same structure, which serves only as a feasibly demonstration and should not limit the scope of the invention. Accordingly, techniques herein provide a structure and integration flow to form a very dense and highly efficient pair of stacked XC in a stacked CFET implementation of ToT 3Di.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a first pair of field-effect transistors formed over a substrate, the first pair of field-effect transistors including a first field-effect transistor positioned over the substrate and a second field-effect transistor stacked over the first field-effect transistor; a second pair of field-effect transistors stacked over the first pair of field-effect transistors, the second pair of field-effect transistors including a third field-effect transistor stacked over the second field-effect transistor and a fourth field-effect transistor stacked over the third field-effect transistor;
a bottom gate structure is disposed around a first channel structure of the first field-effect transistor and positioned over the substrate;

an intermediate gate structure is disposed over the bottom gate structure and around a second channel structure of the second field-effect transistor and a third channel structure of the third field-effect transistor;

a top gate structure is disposed over the intermediate gate structure and around a fourth channel structure of the fourth field-effect transistor; and an inter-level contact is formed that bypasses the intermediate gate structure from a first side of the intermediate gate structure, and that is arranged between the bottom gate structure and the top gate structure.

2. The semiconductor device of claim 1, wherein:
the first channel structure is disposed in a horizontal direction parallel to a top surface of the substrate,
the second channel structure is disposed over the first channel structure in the horizontal direction,
the third channel structure is disposed over the second channel structure in the horizontal direction, and
the fourth channel structure is disposed over the third channel structure in the horizontal direction.

3. The semiconductor device of claim 2, wherein:
the first side of the intermediate gate structure extends less than a first side of the top gate structure and a first side of the bottom gate structure from a central axis of the first channel structure, the second channel structure, the third channel structure, and the fourth channel structure, and
a first side of the second channel structure and a first side of the third channel structure extend less than a first side of the first channel structure and a first side of the fourth channel structure from the central axis.

4. The semiconductor device of claim 3, wherein:
a second side of the top gate structure extends less than a second side of the intermediate gate structure and a second side of the bottom gate structure from the central axis.

5. The semiconductor device of claim 4, further comprising:
an interconnect contact that extends from the intermediate gate structure and bypasses the top gate structure from the second side of the top gate structure.

6. The semiconductor device of claim 4, further comprising:
a first conductive plane that extends along the first sides of the bottom gate structure, the intermediate gate structure and the top gate structure, and spans a height of the first pair of field-effect transistors and the second pair of field-effect transistors, and
a second conductive plane that extends along the second sides of the bottom gate structure, the intermediate gate structure and the top gate structure, and spans the height of the first pair of field-effect transistors and the second pair of field-effect transistors, wherein:
the first conductive plane is coupled to one of the first pair of field-effect transistors and the second pair of field-effect transistors, and
the second conductive plane is coupled to one of the first pair of field-effect transistors and the second pair of field-effect transistors.

7. The semiconductor device of claim 2, wherein each of the first channel structure, the second channel structure, the third channel structure, and the fourth channel structure comprises one or more respective nanosheets that are disposed in the horizontal direction, stacked over one another, and spaced apart from one another.

8. The semiconductor device of claim 2, wherein:
the bottom gate structure includes a bottom dielectric stack around the first channel structure, a bottom work function stack around the bottom dielectric stack, and a bottom gate electrode around the bottom work function stack,
the intermediate gate structure includes a first intermediate dielectric stack around the second channel structure and a second intermediate dielectric stack around the third channel structure, a first intermediate work function stack around the first intermediate dielectric stack, a second intermediate work function stack around the second intermediate dielectric stack, and an intermediate gate electrode around the first intermediate work function stack and the second intermediate work function stack, and
the top gate structure includes a top dielectric stack around the fourth channel structure, a top work function stack around the top dielectric stack, and a top gate electrode around the top work function stack.

9. The semiconductor device of claim 1, wherein the top gate structure and the bottom gate structure are connected to each other through the inter-level contact.

10. The semiconductor device of claim 1, further comprising a dielectric liner that is formed along the first side of the intermediate gate structure, and positioned between the top gate structure and the bottom gate structure and around the inter-level contact.

11. The semiconductor device of claim 1, further comprises:
a first dielectric cap layer positioned between the bottom gate structure and the intermediate gate structure, and
a second dielectric cap layer positioned between the intermediate gate structure and the top gate structure.

12. The semiconductor device of claim 1, wherein:
the first field-effect transistor is one of a n-type field-effect transistor or a p-type field-effect transistor,
the second field-effect transistor is one of a n-type field-effect transistor or a p-type field-effect transistor,
the third field-effect transistor is one of a n-type field-effect transistor or a p-type field-effect transistor, and
the fourth field-effect transistor is one of a n-type field-effect transistor or a p-type field-effect transistor.

* * * * *

UNITED STATES PATENT AND TRADEMARK OFFICE
CERTIFICATE OF CORRECTION

| | | |
|---|---|---|
| PATENT NO. | : 11,532,708 B2 | Page 1 of 1 |
| APPLICATION NO. | : 17/334422 | |
| DATED | : December 20, 2022 | |
| INVENTOR(S) | : Liebmann et al. | |

It is certified that error appears in the above-identified patent and that said Letters Patent is hereby corrected as shown below:

On the Title Page

Column 1, Item (72), in "Inventors", Line 1, delete "Mechanicsville," and insert -- Mechanicville, --, therefor.

Signed and Sealed this
Seventeenth Day of October, 2023

Katherine Kelly Vidal
*Director of the United States Patent and Trademark Office*